United States Patent
Marr et al.

(10) Patent No.: US 9,438,233 B1
(45) Date of Patent: Sep. 6, 2016

(54) LOW-POWER DIGITAL LOGIC USING A BOOLEAN LOGIC SWITCHED INDUCTOR-CAPACITOR (SLC) CIRCUIT

(71) Applicant: Raytheon Company, Waltham, MA (US)

(72) Inventors: Harry B. Marr, Manhattan Beach, CA (US); Kenneth E. Prager, Granite Bay, CA (US); Julia L. Karl, New York, NY (US); Daniel Thompson, Hermosa Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/839,997

(22) Filed: Aug. 30, 2015

(51) Int. Cl.
*H03K 19/20* (2006.01)
*H03K 19/094* (2006.01)
*H03K 19/00* (2006.01)
*H03K 19/08* (2006.01)

(52) U.S. Cl.
CPC ...... *H03K 19/0013* (2013.01); *H03K 19/0806* (2013.01)

(58) Field of Classification Search
CPC ............... H03K 19/0013; H03K 19/0806
USPC ............................. 326/95, 113, 121
See application file for complete search history.

(56) References Cited

U.S. PATENT DOCUMENTS

| 5,955,898 A * | 9/1999 | Sutherland ........... H03K 17/693 326/121 |
| 6,040,717 A * | 3/2000 | Fried ................ H03K 19/1737 326/112 |

OTHER PUBLICATIONS

Soeleman et al., "Ultra-Low Power Digital Subthreshold Logic Circuits*," Departkent of Electrical and Computer Engineering, Purdue Universit, ACM, 1999, pp. 94-96.
Starzyk et al., "A Novel Low-Power Logic Circuit Design Scheme," IEEE Transactions on Circuits and Systems-II: Express Briefs, vol. 54, No. 2, Feb. 2, 2007, pp. 176-180.
Marr et al. "Scaling energy per operation via an asynchronous pipeline," Very Large Scale Integration (VLSI) Systems, IEEE Transactions on 21.1 (2013): 147-151.

* cited by examiner

*Primary Examiner* — Daniel D Chang
(74) *Attorney, Agent, or Firm* — Eric A. Gifford (57) ABSTRACT

A low-power digital logic architecture exhibits the same logic and voltage level behavior as standard digital logic. A logic switch and a pair of unidirectional switches are used to control the direction of charge flow in a switched-inductor capacitor (SLC) circuit, allowing the inductor to pull charge back-and-forth from one side of the load capacitor to the other to both switch the logical state at the top of the capacitor and to recycle and store the charge in the capacitor itself.

16 Claims, 7 Drawing Sheets

| A | Q |
|---|---|
| 0 | 1 |
| 1 | 0 |

| A | B | Y |
|---|---|---|
| 0 | 0 | 1 |
| 0 | 1 | 1 |
| 1 | 0 | 1 |
| 1 | 1 | 0 |

LOW-POWER DIGITAL LOGIC USING A BOOLEAN LOGIC SWITCHED INDUCTOR-CAPACITOR (SLC) CIRCUIT

BACKGROUND OF THE INVENTION

1. Field of the Invention

This invention relates to digital logic, and more particularly to a new low-power architecture for digital logic that uses a switched inductor-capacitor (SLC) circuit to recycle charge while exhibiting the same logic behavior as standard digital logic.

2. Description of the Related Art

A logic gate is an idealized or physical device that implements a Boolean function. The logic gate performs a logical operation on one or more logical inputs, and produces a single logical output. Typical logic gates include "AND", "OR", "INVERTER", "NAND", "NOR", "XOR" and "XNOR". These logic gates are combined to design arbitrary digital logic circuits.

There are several logic families with different characteristics (power consumption, speed, cost, size) such as: RDL (resistor-diode logic), RTL (resistor-transistor logic), DTL (diode-transistor logic), TTL (transistor-transistor logic) and CMOS (complementary metal oxide semiconductor). Since the 1990s, most logic gates are made in CMOS technology (i.e. NMOS and PMOS transistors that function as switches).

Figure 1A:
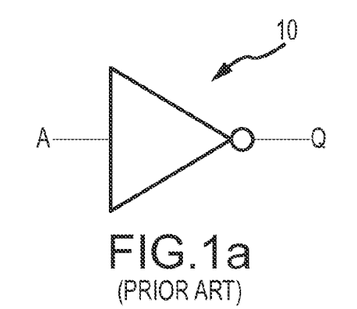
FIGS. 1a through 1c, as described above, are an iconic representation, schematic and truth table for a known inverter logic gate.
Figure 1B:
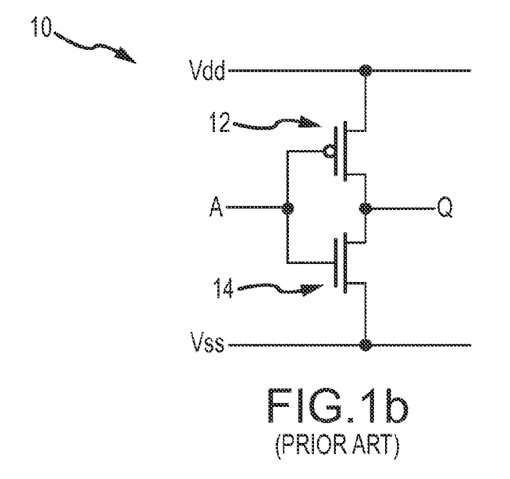
Figure 1C:
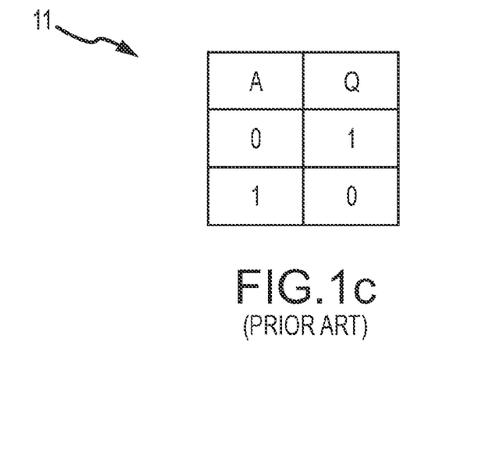

Referring now to FIGS. 1a-1c, an inverter 10 (equivalent to "NOT" logic) receives a logical input A, inverts the logical state and produces an inverted output Q per truth table 11. A typical CMOS embodiment of inverter 10 includes series connected PMOS transistor 12 and NMOS transistor 14 between a high supply Vdd and a low supply Vss (e.g. ground potential). The logical input A is applied to the gates of both transistors. The logical output Q is provided at the series connection between the transistors. A logical input 0, turns PMOS transistor 12 on and NMOS transistor 14 off, which pulls the logical output Q to Vdd, a logical output 1. Conversely, a logical input 1, turns PMOS transistor 12 off and NMOS transistor 14 on, which pulls the logical output Q to Vss, a logical output 0. Each time the logical output changes state, one of the two transistors dissipates charge to the low supply (ground). If the top transistor is on, a path is formed from the supply to the output. If the bottom transistor is on, a path is formed to ground.

Figure 2A:
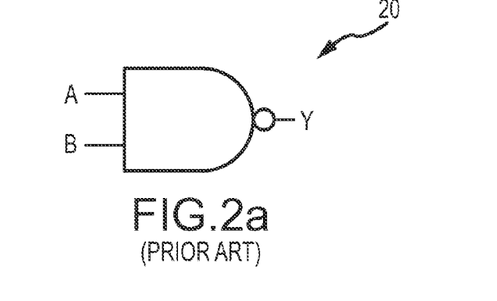
FIGS. 2a through 2c, as described above, are an iconic representation, schematic and truth table for a known NAND logic gate.
Figure 2B:
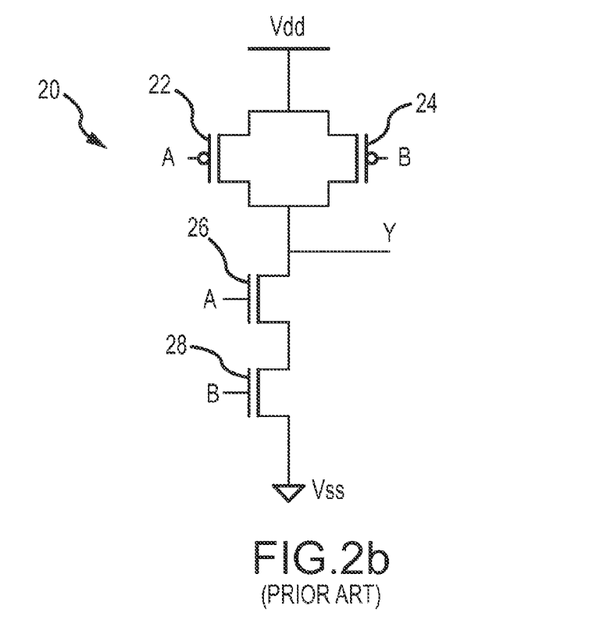
Figure 2C:
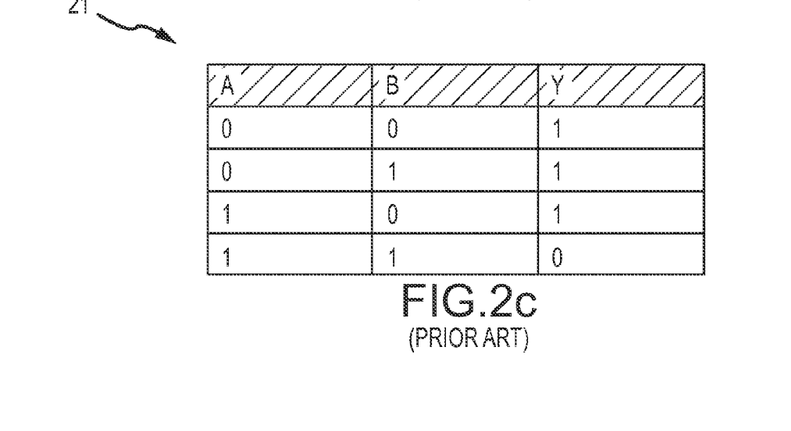

Referring now to FIGS. 2a-2c, a NAND gate 20 receives logical inputs A and B and performs the Boolean logic NAND (Not AND) function to produce logical output Y per truth table 21. A typical CMOS embodiment of NAND gate 20 includes a parallel connection of PMOS transistors 22 and 24 with a common drain connection to the high supply Vss. Their common source connection is connected to the top of a pair of series connected NMOS transistors 26 and 28 to the low supply Vss (ground). Logical inputs A and B are each applied to the gates of different ones of the NMOS and PMOS transistors, respectively. The logical output Y is produced at the top of the series connected NMOS transistors. If either logical input is 0, the logical output Y is pulled up to the high supply Vdd to logical output 1. If both logical inputs are 1, the parallel connected PMOS transistors are turned off and the series connected NMOS transistors are turned on pulling the logical output Y to the low supply Vss to logical output 0. Each time the logical output changes state, at least one of the transistors dissipates charge to the low supply (ground) or the output.

The demand for low power logic gates is acute. Often millions or even billions of logic gates are packaged to form a single integrated circuit. The density and switching speeds of logic gates is increasing at the same time that the use of battery operated wireless devices has soared.

Power dissipation in a CMOS based logic circuit is attributable to leakage current, short circuit current and switching energy. The leakage and short circuit current can be reduced to very low levels. Switching energy is more problematic. When a logic gate changes state, energy stored in the NMOS or PMOS transistors is dissipated. Extensive efforts have been made to reduce the switching energy in digital logic.

One approach to providing ultra-low power is to operate the digital logic gates in the subthreshold region. The incentive of operating the circuit in subthreshold mode is to be able to exploit the subthreshold leakage current as the operating drive current. This approach only allows quadratic reductions in power and sacrifices switching speed. Subthreshold logic consumes about 20 fj to 50 fj per switching operation. See Hendrawan Soeleman and Kaushik Roy "Ultra-Low Power Digital Subthreshold Logic Circuits" ISPLED, San Diego, Calif., 1999.

Asynchronous logic reduces power consumption but again only by a polynomical factor. See Marr, Bo, et al. "Scaling Energy Per Operation via an Asynchronous Pipeline." *Very Large Scale Integration (VLSI) Systems, IEEE Transactions on* 21.1 (2013): 147-151.

Janusz A. Starzyk and Haibe He, "A Novel Low Power Logic Circuit Design Scheme", IEEE Transactions on Circuits and Systems—II: Express Briefs, Vol. 54, No. 2, February 2007 is based on energy exchange in a Switched Inductor-Capacitor (SLC) circuit. Each time the logic circuit is switched, and the load capacitor discharged, instead of dissipating the energy to ground the energy is stored in the magnetic field of the inductor. As shown in FIG. 1 of this IEEE paper, a basic logic gate structure consists of a switch control unit (SCU) with two control signals s1 and s2 and two energy storage elements—inductor (L) and load capacitor C. Inside the SCU, there are four switches controlled by two-phase control signals CS1 and CS2, which control switches s1 and s2, respectively. This circuit works as an inverter. Based on the control signals CS1 and CS2 value, this circuit will have four phases of operation illustrated in FIG. 3 of this IEEE paper. While CS1 is an arbitrary input signal, CS2 is the CS1 signal shifted by T/4. Various logic gates can be built using the described energy exchange and storage mechanism.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a low-power digital logic architecture that exhibits the same logic and voltage level behavior as standard digital logic.

To accomplish this, the low-power digital logic uses a logic switch and a pair of unidirectional switches to control the direction of charge flow in a SLC circuit, allowing the inductor to pull charge back-and-forth from one side of the load capacitor to the other to both switch the logical state at the top of the capacitor and to recycle and store the charge in the capacitor itself.

In an embodiment, the digital logic comprises a switched inductor-capacitor (SLC) circuit comprising a load capacitor, an inductor and a pair of unidirectional switches configured to switch in opposition to allow charge to flow either in a clockwise direction or a counter clockwise direction around the circuit. A logic switch implements a Boolean logic function (e.g. inverter, AND, NAND, etc.). The logic switch is responsive to at least a first logical input to configure the unidirectional switches to select the direction of charge flow. The inductor pulls charge from one side of the load capacitor to the other side of the load capacitor to switch a logical output at the top of the load capacitor. The unidirectional switches trap charge on either side of the load capacitor to hold the logical output and prevent oscillation of the SLC circuit.

In an embodiment, the logic switch comprises a pair of pass-through logic (PTL) cells that each implements the Boolean logic function. Each cell has a logical input coupled to the first logical input, a bias input and first and second parallel outputs that switch in opposition. In each cell, one of the outputs is coupled directly to the load capacitor and the other output is coupled through the unidirectional switch to the capacitor. The pair of cells is coupled to the top and bottom of the capacitor, respectively. The storage inductor is coupled between the bias inputs of the first and second PTL cells. To allow charge to flow in a clockwise direction, the top cell enables the unidirectional switch and disables its other output while the bottom cell disables the unidirectional switch and enables it other output. To allow charge to flow in a counter clockwise direction, the bottom cell enables the unidirectional switch and disables its other output while the top cell disables the unidirectional switch and enables it other output.

In non-ideal devices, stored energy is reduced through leakage current or dissipated on path resistance. In different embodiments, a recharge circuit is used to provide a ground reference at the bottom the capacitor to recharge the logical output at the top of the capacitor. First and second recharge circuits are coupled to the top and bottom of the load capacitor, respectively. The recharge circuits are suitably "pulsed" to provide the ground reference for a period of time sufficient to recharge the logical output and remaining floating otherwise to reduce leakage.

In an embodiment, a low-power digital logic circuit comprises first and second pass-through logic (PTL) cells that each implements the same Boolean logic. Each cell has a logical input, a bias input and first and second parallel outputs configured to switch in opposition. An inductor is coupled between the bias inputs of the first and second PTL cells. A first unidirectional switch is coupled between the second output of the first PTL cell and a logical output at the top of a load capacitor. When enabled the first unidirectional switch allows the inductor to pull charge from the bottom of the capacitor through the inductor to the top of the load capacitor to switch a logic level 1 at the logic output. The first unidirectional switch traps charge on the top of the capacitor to hold the logic level 1 and prevent oscillation. A second unidirectional switch is coupled between the first output of the second PTL cell and the bottom of the load capacitor. When enabled the second unidirectional switch allows the inductor to pull charge from the top of the capacitor through the inductor to the bottom of the load capacitor to switch a logic level 0 at the logical output. The second unidirectional switch traps charge on the bottom of the capacitor to hold the logic level 0 and prevent oscillation.

These and other features and advantages of the invention will be apparent to those skilled in the art from the following detailed description of preferred embodiments, taken together with the accompanying drawings, in which:

DETAILED DESCRIPTION OF THE INVENTION

A goal of a low-power architecture for digital logic is to exhibit the same logic and voltage level behavior as the standard digital logic. The exact same logic inputs and logical outputs should characterize the low-power digital logic. Moreover, similar voltage levels should be created at the logical output. To achieve lower power, the architecture may have different internal physical characteristics and switching speeds.

Starzyk's low power logic circuit design scheme based on a SLC circuit does not exhibit the same logical behavior as standard CMOS gates. Specifically, two control signals CS1 and CS2 are used to control four switches. The use of two control signals CS1 and CS2 and the manner in which they are used is not consistent with standard input logic.

The present invention provides low-power digital logic that exhibits the same logic and voltage level behavior as standard digital logic. The low-power digital logic uses a logic switch and a pair of unidirectional switches to control the direction of charge flow in a SLC circuit, allowing the inductor to pull charge back-and-forth from one side of the load capacitor to the other to both switch the logical state at the top of the capacitor and to recycle and store the charge in the capacitor itself. Charge is not stored in the inductor. The low-power digital logic will be described in terms of CMOS technology and logic gates but is generally applicable to other digital technologies including but not limited to FinFET, CNMOS, Quantum-dot FETs, SOI, CNTMOS and BiCMOS.

Figure 3:
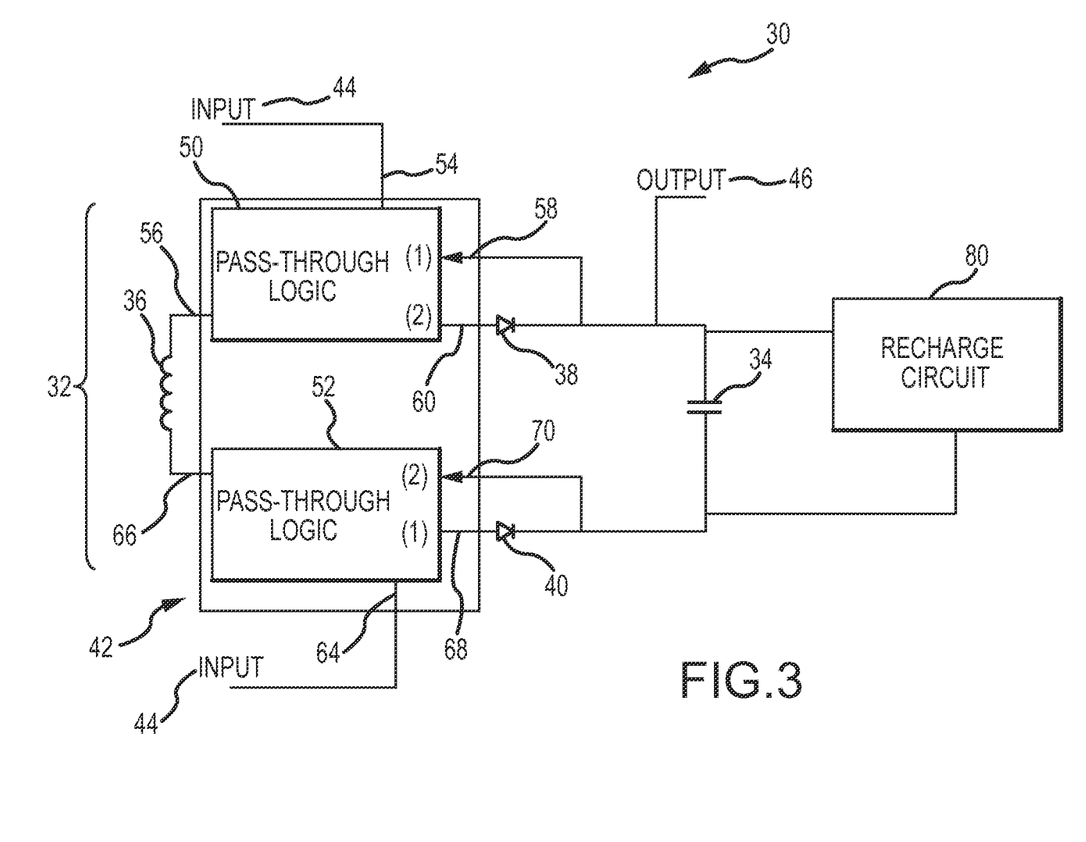
FIG. 3 is an embodiment of a low-power digital logic architecture based on a SLC circuit.
Figure 4A:
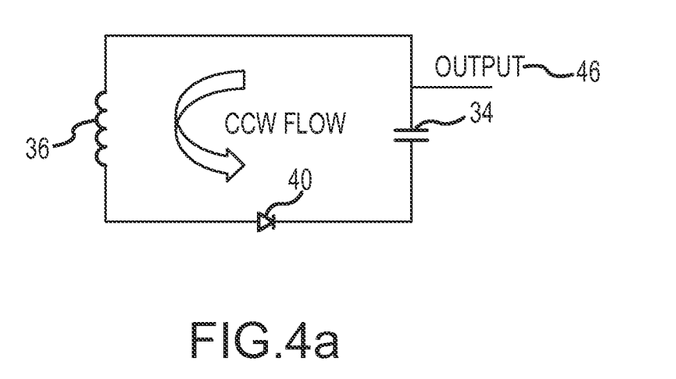
FIGS. 4a and 4b are equivalent circuits of the low-power digital logic architecture for logical outputs 0 and 1, respectively.
Figure 4B:
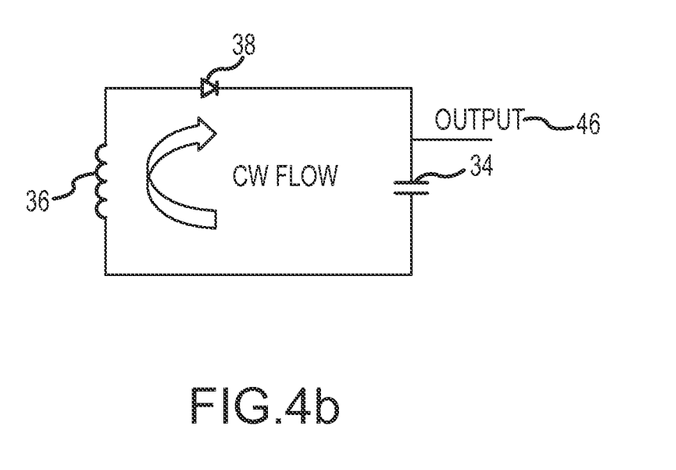

Referring now to FIGS. 3, 4a and 4b, a low-power digital logic circuit 30 comprises a switched inductor-capacitor (SLC) circuit 32 comprising a load capacitor 34, an inductor 36 and a pair of unidirectional switches 38 and 40 (e.g., diode-connected MOSFET devices) configured to switch in opposition to allow charge to flow either in a clockwise direction (FIG. 4b) or a counter clockwise direction (FIG. 4a) around the circuit. A logic switch 42 implements a Boolean logic function (e.g. inverter, AND, NAND, etc.). The logic switch 42 is responsive to at least a first logical input 44 to configure the unidirectional switches 38 and 40 to select the direction of charge flow.

As shown in FIG. 4a, the equivalent circuit for a logical output of 0 includes inductor 36, unidirectional switch 40 and load capacitor 34 with charge flowing in the counter clockwise direction. As shown in FIG. 4b, the equivalent circuit for a logical output of 1 includes inductor 36, unidirectional switch 38 and load capacitor 34 with charge flowing in the clockwise direction. The inductor 36 pulls charge from one side of the load capacitor 34 to the other side of the load capacitor to switch a logical output 46 at the top of the load capacitor 34. The unidirectional switches 38 and 40 trap charge on either side of the load capacitor to hold the logical output and prevent oscillation of the SLC circuit.

In a generic LC circuit a capacitor stores energy in the electric field (E) between its plates, depending on the voltage across it, and an inductor stores energy in its magnetic field (B), depending on the current through it. If an inductor is connected across a charged capacitor, current will start to flow through the inductor, building up a magnetic field around it and reducing the voltage on the capacitor. Eventually all the charge on the capacitor will be gone and the voltage across it will reach zero. However, the current will continue, because inductors resist changes in current. The current will begin to charge the capacitor with a voltage of opposite polarity to its original charge. Due to Faraday's law, the electro-motive force that drives the current is caused by a decrease in the magnetic field, thus the energy required to charge the capacitor is extracted from the magnetic field. When the magnetic field is completely dissipated the current will stop and the charge will again be stored in the capacitor, with the opposite polarity as before. Then the cycle will begin again, with the current flowing in the opposite direction through the inductor. The charge flows back and forth between the plates of the capacitor, through the inductor. The energy oscillates back and forth between the capacitor and the inductor until (if not replenished from an external circuit) internal resistance makes the oscillations die out.

The low-power digital logic circuit 30 utilizes the basic LC circuit to move charge back-and-forth from the top of the load capacitor 34 to the bottom of the load capacitor 34 to efficiently store and "recycle" charge. The only energy lost is dissipated through resistance in the SLC circuit. The low-power digital logic circuit 30 modifies the basic LC circuit to include the pair of unidirectional switches 38 and 40 and logic switch 42. The logic switch determines for a given logical input whether the logical output should be a "1" or a "0" based on the implemented Boolean logic function. The logic switch enables one of the unidirectional switches and disables the other to allow charge to flow in the clockwise or counter clockwise direction to produce the logical output. If the logical output is already in the specified state, nothing happens. The unidirectional switches do not allow current to flow backward through the switches, effectively trapping charge on the capacitor in the current state. If the logical output is to be switched, the inductor will pull current from one side of the capacitor through the inductor, temporarily storing energy in the magnetic field of the inductor, to the other side of the capacitor to switch the logical output. However, at this point the cycle will not begin again. The enabled unidirectional switch will not allow charge to flow backwards through the switch. The charge is trapped on the one side of the capacitor to hold the logical output and prevent oscillation. Together the LC circuit, logic switch and pair of unidirectional switches initiate charge transfer to switch the logical output and then trap charge to hold the logical output.

Referring again to FIG. 3, in an embodiment logic switch 42 comprises a pair of pass-through logic (PTL) cells 50 and 52 that each implements the Boolean logic function. Cell 50 has a logical input 54 coupled to the first logical input 44, a bias input 56 and first and second parallel outputs 58 and 60 that switch in opposition. The first output 58 is coupled directly to logical output 46 at the top of load capacitor 34. The second output 60 is coupled through unidirectional switch 38 to logical output 46 at the top of load capacitor 34. Cell 52 has a logical input 64 coupled to the first logical input 44, a bias input 66 and first and second parallel outputs 68 and 70 that switch in opposition. The first output 68 is coupled through unidirectional switch 40 to the bottom of load capacitor 34. The second output 70 is coupled directly to the bottom of load capacitor 34. An equivalent logic circuit includes a pair of PTL cells one of which implements the Boolean logic function and one of which implements the inverted (or "not") of the Boolean logic function, in which the unidirectional switches are connected to the same outputs of the cells.

To switch the logical output 46 to a "0", cells 50 and 52 disable their second outputs 60 and 70, respectively, and enable their first outputs 58 and 68, respectively, to configure the circuit as shown in FIG. 4a. To switch the logical output 46 to a "1", cells 50 and 52 enable their second outputs 60 and 70, respectively, and disable their first outputs 58 and 68, respectively, to configure the circuit as shown in FIG. 4b.

Referring again to FIG. 3, in non-ideal devices, stored energy is reduced through leakage current or dissipated on path resistance. A recharge circuit 80 is used to provide a ground reference at the bottom of load capacitor 34 to recharge the logical output 46 at the top of the load capacitor. Separate recharge circuits are coupled to the top and bottom of the load capacitor, respectively. The recharge circuits are suitably "pulsed" to provide the ground reference for a period of time sufficient to recharge the logical output and remaining floating otherwise to reduce leakage.

Figure 5:
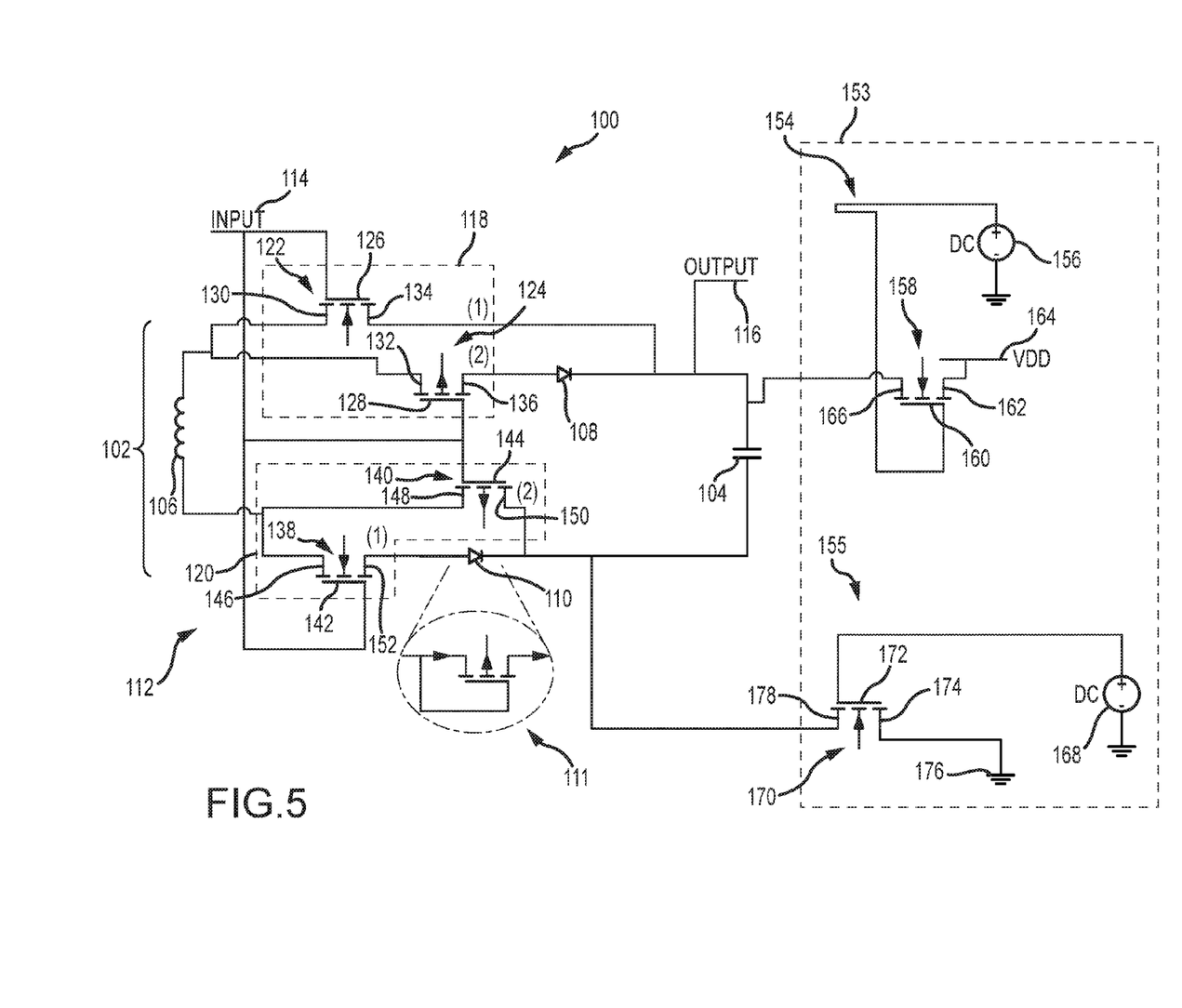
FIG. 5 is a schematic diagram of an embodiment of a low-power inverter and a recharging circuit.

Referring now to FIG. 5, an embodiment of a low-power digital CMOS logic circuit 100 for an inverter logic gate comprises a switched inductor-capacitor (SLC) circuit 102 including a load capacitor 104, an inductor 106 and a pair of unidirectional switches 108 and 110 (e.g., diode-connected MOSFET devices) configured to switch in opposition to allow charge to flow either in a clockwise direction or a counter clockwise direction around the circuit. Logic switch 112 implements logic for an inverter. The logic switch 112 is responsive to a logical input 114 to configure the unidirectional switches 108 and 110 to select the direction of charge flow to switch a logical output 116 at the top of the load capacitor.

Logic switch 112 includes a pair of PTL cells 118 and 120, each cell comprising a parallel-connection of an NMOS transistor (switch) and a PMOS transistor (switch) to implement the inverter function. Cell 118 (120) is coupled between the top (bottom) of inductor 106 and the top (bottom) of load capacitor 104.

Cell 118 comprises an NMOS transistor 122 and a PMOS transistor 124 whose gates 126 and 128, respectively, are connected to logical input 114 and whose drains 130 and 132, respectively, are connected to the top of inductor 106. The source 134 of the NMOS transistor forms the first output that is directly connected to the logical output 116 at the top of load capacitor 104. The source 136 of the PMOS transistor forms the second output that is connected through unidirectional switch 108 to the logical output 116 at the top of load capacitor 104.

Cell 120 comprises an NMOS transistor 138 and a PMOS transistor 140 whose gates 142 and 144, respectively, are connected to logical input 114 and whose drains 146 and 148, respectively, are connected to the bottom of inductor 106. The source 150 of the PMOS transistor forms the second output that is directly connected to the bottom of load capacitor 104. The source 152 of the NMOS transistor forms the first output that is connected through unidirectional switch 110 to the bottom of load capacitor 104.

The NMOS and PMOS transistors that constitute the PTL cell have a characteristic threshold voltage. Similarly, the diode-connected MOSFET that forms the unidirectional switch has a threshold voltage. In an embodiment, the threshold voltage of the diode-connected MOSFET is less than the threshold voltage of the NMOS and PMOS transistors so that the unidirectional switch will turn on quickly at a low voltage.

Assume an initial condition of a logic output state of "0" at logical output 116. All of the charge is being held on the bottom of load capacitor 104 where it is trapped by forward-biased unidirectional switch 110.

When a logic state "0" is applied to logical input 114, the NMOS transistors 122 and 138 are effectively open switches (no charge can pass through) and the PMOS transistors 124 and 140 are effectively closed switches (charge can pass through). Inductor 106 pulls charge held on the bottom of load capacitor 104 through PMOS transistor 140, through the inductor, through PMOS transistor 124, through forward biased unidirectional switch 108 to charge the top of load capacitor 104 and switch the state at logical output 116 to a "1". The forward biased unidirectional switch 108 prevents charge from flowing backwards through the circuit, effectively trapping charge on the top of the load capacitor to hold the logical output state. The LC circuit executes one cycle to move charge from the bottom of the load capacitor to the top of the load capacitor where it remains.

When a logic state "1" is applied to logical input 114, the NMOS transistors 122 and 138 are effectively closed switches (charge can pass through) and the PMOS transistors 124 and 140 are effectively open switches (no charge can pass through). Inductor 106 pulls charge held on the top of load capacitor 104 through NMOS transistor 122, through the inductor, through NMOS transistor 138, through forward biased unidirectional switch 110 to charge the bottom of load capacitor 104 and switch the state at logical output 116 to a "0". The forward biased unidirectional switch 118 prevents charge from flowing backwards through the circuit, effectively trapping charge on the bottom of the load capacitor to hold the logical output state. The LC circuit executes one cycle to move charge from the top of the load capacitor to the bottom of the load capacitor where it remains.

A recharge circuit 150 is used to provide a ground reference at the bottom of load capacitor 104 to recharge the logical output 116 at the top of the load capacitor. Separate recharge circuits 152 and 154 are coupled to the top and bottom of the load capacitor, respectively. Recharge circuit 152 includes a pulsed recharge source (e.g., a DC voltage supply) 156 and a PMOS transistor 158 whose gate 160 is connected to the recharge source, drain 162 is connected to a high supply voltage VDD 164, and source 166 is connected to the top of the capacitor. Recharge circuit 154 includes a pulsed recharge source (e.g., a pulsed DC voltage supply) 168 and a NMOS transistor 170 whose gate 172 is connected to the pulsed recharge source, drain 174 is connected to ground potential 176, and source 178 is connected to the bottom of the capacitor. When recharge source 168 is pulsed, NMOS transistor 170 turns on and pulls the bottom of the capacitor to ground potential 176. This in turn pulls the voltage at the top of the capacitor down, which turns PMOS transistor 158 on pulling the top of the capacitor to the high supply voltage VDD. The pulse is momentary, just long enough to recharge the load capacitor. Otherwise NMOS transistor 170 remains off, which leaves the circuit floating.

Digital logic circuits using current CMOS transistors at the 32 nm node have a maximum switching speed of approximately 6 GHz under isolated test conditions to max maximum transistor switching speed. However, due to interconnect capacitance and other realities seen in an integrated circuit, 32 nm CMOS clock speeds are at maximum about 3 GHz. Energy consumption per switch for a logic cell can often range into the picoJoule range. Subthreshold logic has a maximum switching speed of at maximum approximately a few MHz and more typically in the 100 KHz range and consume approximately 20-50 (fJ) per switching operation. The present invention has demonstrated switching speeds of approximately 16 GHz and energy consumption of approximately 54 atto Joules (aJ) per switching operation due to resistive losses. This topology can reduce energy per switching operation by up to 1,000× while maintaining the same logical behavior with minimal sacrifice of switching speed.

Figure 6A:
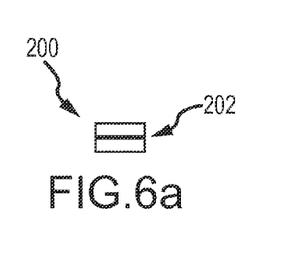
FIGS. 6a and 6b are notional layout drawings of a standard CMOS inverter and the low-power inverter, respectively.
Figure 6B:
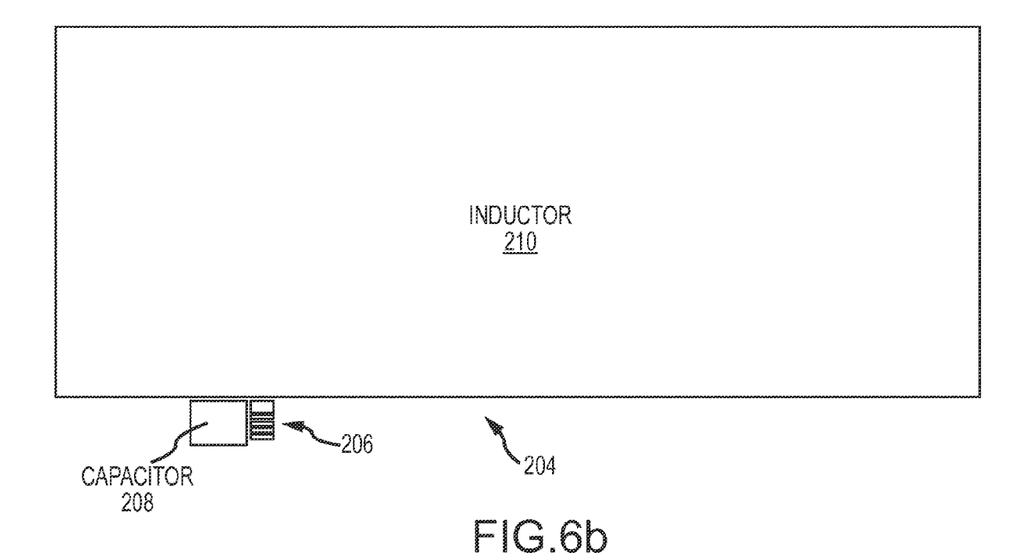

The cost of this substantial reduction in power is real estate on the integrated circuit (IC) or printed circuit board (PCB). The foot print of the load capacitor and, even more so, the inductor dwarfs the size of the transistors. Referring now to FIG. 6a, an inverter 200 of the type shown in FIGS. 1a-1c includes two CMOS transistors 202. Referring now to FIG. 6b, an inverter 204 of the type shown in FIG. 5 includes 6 CMOS transistors 206, a load capacitor 208 and an inductor 210. The devices are shown to scale with 1 inch on the drawing corresponding to 1 micron.

Figure 7:
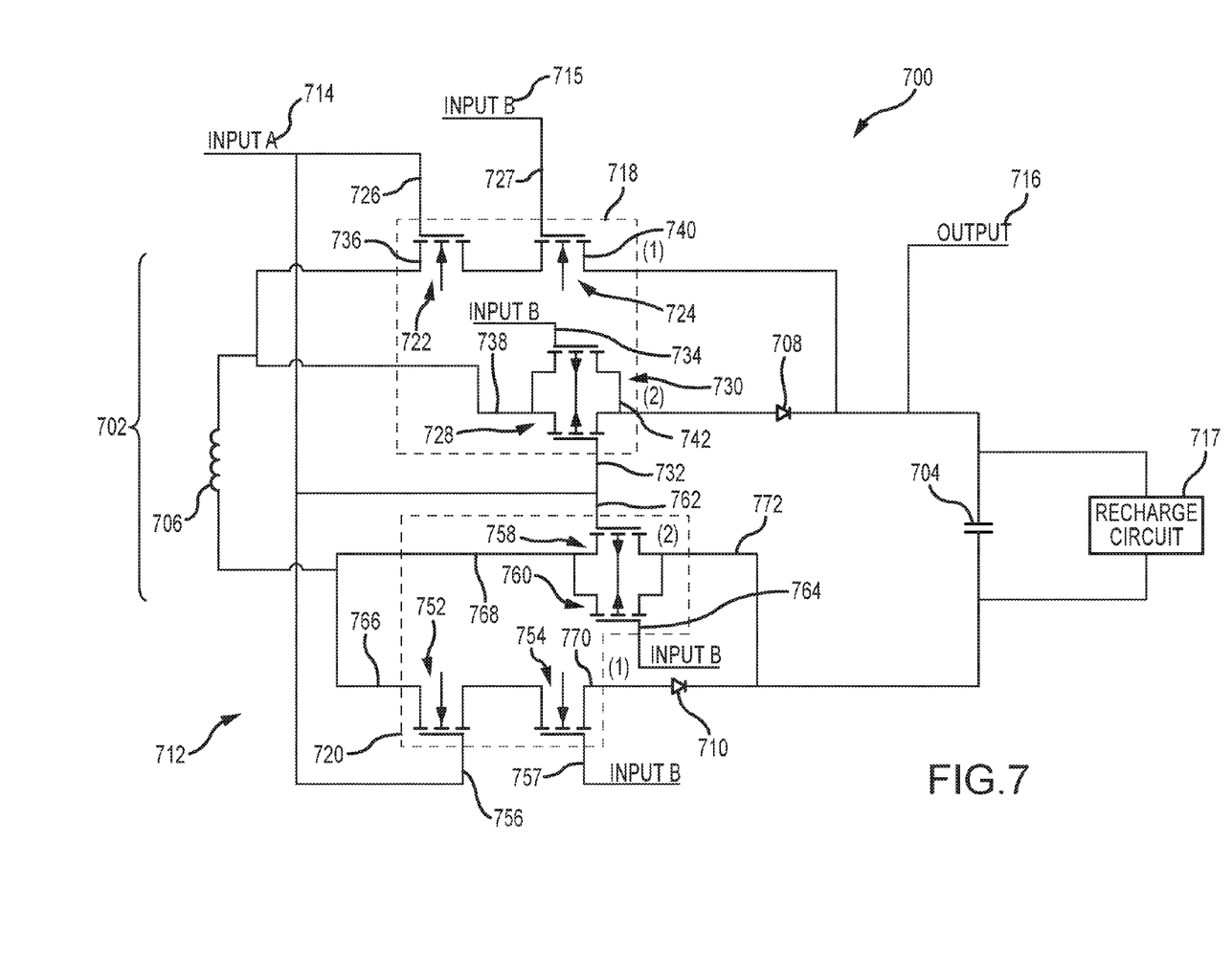
FIG. 7 is a schematic diagram of an embodiment of a low-power NAND gate.

Referring now to FIG. 7, an embodiment of a low-power digital CMOS logic circuit 700 for a NAND logic gate comprises a switched inductor-capacitor (SLC) circuit 702 including a load capacitor 704, an inductor 706 and a pair of unidirectional switches 708 and 710 (e.g., diode-connected MOSFET devices) configured to switch in opposition to allow charge to flow either in a clockwise direction or a counter clockwise direction around the circuit. Logic switch 712 implements logic for a NAND gate. The logic switch 712 is responsive to a logical inputs 714 and 715 to configure the unidirectional switches 708 and 710 to select the direction of charge flow to switch a logical output 716 at the top of the load capacitor. A recharge circuit 717 periodically recharges the circuit.

Logic switch 712 includes a pair of PTL cells 718 and 720, each cell comprising a parallel connection of series connected first and second NMOS transistors whose gate inputs are coupled to the first and second logical inputs, respectively, and parallel connected first and second PMOS transistors whose gate inputs are coupled to the first and second logical inputs, respectively, to implement the inverter function. Cell 718 (720) is coupled between the top (bottom) of inductor 706 and the top (bottom) of load capacitor 704.

Cell 718 comprises a parallel connection of series connected first and second NMOS transistors 722 and 724 whose gate inputs 726 and 727 are coupled to the first and second logical inputs, respectively, and parallel connected first and second PMOS transistors 728 and 730 whose gate inputs 732 and 734 are coupled to the first and second logical inputs, respectively. The drain 736 of NMOS transistor 722 and the common drain connection 738 of PMOS transistors 728 and 730 is connected to the top of inductor 706. The source 740 of NMOS transistor 724 forms the cell's first output that is directly connected to the top of load capacitor 704. A common source connection 742 of PMOS transistors 728 and 730 for the cell's second output is connected through unidirectional switch 708 to the top of the capacitor.

Cell 720 comprises a parallel connection of series connected first and second NMOS transistors 752 and 754 whose gate inputs 756 and 757 are coupled to the first and second logical inputs, respectively, and parallel connected first and second PMOS transistors 758 and 760 whose gate inputs 762 and 764 are coupled to the first and second logical inputs, respectively. The drain 766 of NMOS transistor 752 and the common drain connection 768 of PMOS transistors 758 and 760 is connected to the top of inductor 706. The source 770 of NMOS transistor 754 forms the cell's first output that is connected through unidirectional switch 710 to the bottom of load capacitor 704. A common source connection 772 of PMOS transistors 758 and 760 form the cell's second output that directly connected to the bottom of the capacitor.

Assume an initial condition of a logic output state of "0" at logical output 716. All of the charge is being held on the bottom of load capacitor 704 where it is trapped by forward-biased unidirectional switch 710. Consider the inputs A=0, B=0 that generates a logical output 1. The NMOS transistors are effectively open switches (no charge can pass through) and the PMOS transistors are effectively closed switches (charge can pass through). In cell 718, output 1 is disabled and output 2 is enabled forward biasing unidirectional switch 708. Conversely in cell 718, output 1 is disabled and output 2 is enabled connecting the bottom of load capacitor 704 to the bottom of inductor 706. Inductor 706 pulls charge from the bottom of the load capacitor through the inductor and through forward biased unidirectional switch 708 to charge the top of the capacitor to switch the logical output to "1". The forward biased unidirectional switch 708 traps charge on the top of the load capacitor to hold the logical output 1 until switched.

As illustrated in FIGS. 1b and 1c, in a standard digital logic circuit a gate includes a series connection of upper and lower logic units between a high voltage supply Vdd and ground. The logical input(s) is applied to each logic unit. The logical output is produced at the connection between the upper and lower logic units. These units are configured such that the lower unit turns on and the upper unit turns off when the logical output is switched to a logic level 0 and the lower unit turns off and the upper unit turns on when the logical output is switched to a logic level 1. This switches the logic level between ground and the high supply. The configuration of the upper and lower logic units depends on the Boolean logic function.

In the present invention, for a given logical gate, each PTL cell rearranges the series connected upper and lower logic units from the standard digital logic circuit in a parallel configuration that is connected between the inductor and the capacitor. The upper and lower logic units produce the first and second analog outputs that are enabled in opposition. One of the outputs is connected directly to the capacitor and the other is connected through a unidirectional switch to the capacitor to drive the logical output. This represents an approach to implementing the logic in the PTL cell.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A low-power digital logic circuit, comprising:
a switched inductor-capacitor (SLC) circuit comprising a load capacitor, an inductor and a pair of unidirectional switches configured to switch in opposition to allow charge to flow either in a clockwise direction or a counter clockwise direction around the circuit, and a logic switch that implements a Boolean logic function, said logic switch responsive to a first logical input to configure the unidirectional switches to select the direction of charge flow, said inductor pulling charge from one side of the load capacitor to the other side of the load capacitor to switch a logical output at the top of the load capacitor, said unidirectional switches trapping charge on either side of the load capacitor to hold the logical output and prevent oscillation of the SLC circuit.

2. The low-power digital logic circuit of claim 1, wherein a first one of said unidirectional switches is coupled between the top of the inductor and the top of the capacitor to allow charge flow in a clockwise direction to the top of the capacitor and to trap charge on the top of the capacitor to hold a logical output 1, a second one of said unidirectional switches is coupled between the bottom of the inductor and the bottom of the capacitor to allow charge flow in a counter clockwise direction to the bottom of the capacitor and to trap charge on the bottom of the capacitor to hold a logical output 0, wherein the logic switch is coupled between the inductor and the first and second unidirectional switches to turn the first unidirectional switch on and the second unidirectional switch off to allow charge flow in the clockwise direction and to turn the second unidirectional switch on and the first unidirectional switch off to allow charge flow in the counter clockwise direction.

3. The low-power digital logic circuit of claim 1, wherein the transistors are implemented with CMOS technology, wherein the switching energy is less than 54 atto Joules (aJ) per switching operation.

4. The low-power digital logic circuit of claim 1, wherein the only energy lost is dissipated through resistance in the SLC circuit.

5. The low-power digital logic circuit of claim 1, further comprising:
a first recharge circuit coupled to the top of the load capacitor to recharge the voltage to a specified level for logic output 1; and
a second recharge circuit coupled to the bottom of the load capacitor to provide a ground reference for the voltage on the top of the load capacitor.

6. The low-power digital logic circuit of claim 5, wherein the recharge circuits are pulsed so that the circuit provides the ground reference for a period of time to recharge the capacitor and remains floating otherwise.

7. The low-power digital logic circuit of claim 1, wherein the unidirectional switches have a threshold voltage that is less than a threshold voltage of the logic switch.

8. The low-power digital logic circuit of claim 1, wherein each unidirectional switch comprises a diode connected transistor.

9. The low-power digital logic circuit of claim 1, wherein the logic switch implements the Boolean logic function from one of an "AND", "OR", "NOT", "NAND", "NOR", "XOR" and "XNOR".

10. The low-power digital logic circuit of claim 1, wherein the logic switch comprises first and second pass-through logic (PTL) cells that each implement the Boolean logic function, each said PTL cell having a logical input coupled to the first logical input, a bias input and first and second parallel outputs that switch in opposition, wherein one of the unidirectional switches is coupled between the second output of the first PTL cell and the logical output at the top of the load capacitor, the cell's first output being coupled to the top of the load capacitor, and the other unidirectional switch is coupled between the first output of the second PTL cell and the bottom of the load capacitor, the cell's second output being coupled to the bottom of the load capacitor, wherein the storage inductor is coupled between the bias inputs of the first and second PTL cells.

11. The low-power digital logic circuit of claim 10, wherein each said PTL cell implements a "NOT" Boolean logic function, wherein said first PTL cell comprises an NMOS transistor and a PMOS transistor having a common gate input coupled to the first logical input and a common drain connection to the top of the inductor, said NMOS transistor's source coupled to the top plate of the output capacitor, said PMOS transistor's source coupled to a first one of the unidirectional switches, wherein said second PTL cell comprises an NMOS transistor and a PMOS transistor having a common gate input coupled to the first logical input and a common drain connection to the bottom of the inductor, said PMOS transistor's source coupled to the bottom plate of the output capacitor, said NMOS transistor's source coupled to a second one of the unidirectional switches.

12. The low-power digital logic circuit of claim 10, wherein each said PTL cell implements a "NAND" Boolean logic function, wherein said first PTL cell comprises first and second NMOS transistors connected in series between the top of the inductor and the top of the capacitor and first and second PMOS transistors connected in parallel between the top of the inductor and a first one of the unidirectional switches, said first NMOS and PMOS transistors' gates coupled to the first logical input and said second NMOS and PMOS transistors' gates coupled to a second logical input, wherein said second PTL cell comprises first and second NMOS transistors connected in series between the bottom of the inductor and the second one of the unidirectional switches and first and second PMOS transistors connected in parallel between the bottom of the inductor and the bottom of the capacitor, said first NMOS and PMOS transistors' gates coupled to the first logical input and said second NMOS and PMOS transistors' gates coupled to a second logical input.

13. A low-power digital logic circuit, comprising:
a first logical input;
a logical output;
a load capacitor;

first and second pass-through logic (PTL) cells that each implement the same Boolean logic, each said PTL cell having a logical input, a bias input and first and second parallel outputs configured to switch in opposition, said logical inputs of said PTL cells coupled to the first logical input;
an inductor coupled between the bias inputs of the first and second PTL cells;
a first unidirectional switch coupled between the second output of the first PTL cell and the logical output at the top of the load capacitor, when enabled said first unidirectional switch allowing the inductor to pull charge from the bottom of the capacitor through the inductor to the top of the load capacitor to switch a logic level 1 at the logical output, said first unidirectional switch trapping charge on the top of the capacitor to hold the logic level 1 and prevent oscillation;
a second unidirectional switch coupled between the first output of the second PTL cell and the bottom of the load capacitor, when enabled said second unidirectional switch allowing the inductor to pull charge from the top of the capacitor through the inductor to the bottom of the load capacitor to switch a logic level 0 at the logical output, said second unidirectional switch trapping charge on the bottom of the capacitor to hold the logic level 0 and prevent oscillation.

14. The low-power digital logic circuit of claim 13, further comprising:
a first recharge circuit coupled to the top of the load capacitor to recharge the voltage to a specified level for logic output 1; and
a second recharge circuit coupled to the bottom of the load capacitor to provide a ground reference for the voltage on the top of the load capacitor.

15. The low-power digital logic circuit of claim 14, wherein the recharge circuits are pulsed so that the circuit provides the ground reference for a period of time to recharge the capacitor and remains floating otherwise.

16. A low-power digital logic circuit, comprising a pair of pass-through logic (PTL) cells that are coupled between opposite sides of an inductor and a load capacitor, each said PTL cell configured to receive at least a first logical input and implement the same Boolean logic to switch first and second parallel outputs in opposition, one said output in each PTL connected directly to the load capacitor and the other said output connected through a unidirectional switch to the load capacitor, said PTL cells responsive to the first logical input to switch the unidirectional switches in opposition to allow charge to flow either in a clockwise direction to the top of the load capacitor or in a counter clockwise direction to the bottom of the load capacitor to switch a logical output at the top of the load capacitor, said unidirectional switches trapping charge on either side of the load capacitor to hold the logical output and prevent oscillation.

* * * * *